United States Patent
Glezer et al.

(10) Patent No.: US 7,252,140 B2
(45) Date of Patent: Aug. 7, 2007

(54) APPARATUS AND METHOD FOR ENHANCED HEAT TRANSFER

(75) Inventors: Ari Glezer, Atlanta, GA (US);
Raghavendran Mahalingam, Decatur, GA (US)

(73) Assignee: Nuveatix, Inc., Austin, TX (US)

( * ) Notice: Subject to any disclaimer, the term of this patent is extended or adjusted under 35 U.S.C. 154(b) by 0 days.

(21) Appl. No.: 11/217,759

(22) Filed: Sep. 1, 2005

(65) Prior Publication Data
US 2006/0050482 A1 Mar. 9, 2006

Related U.S. Application Data

(60) Provisional application No. 60/607,187, filed on Sep. 3, 2004.

(51) Int. Cl.
*F28F 7/02* (2006.01)

(52) U.S. Cl. .................... 165/80.3; 165/908

(58) Field of Classification Search ...... 165/80.1–80.3, 165/109.1, 908; 361/691, 694
See application file for complete search history.

(56) References Cited

U.S. PATENT DOCUMENTS

| | | | |
|---|---|---|---|
| 5,040,560 A | 8/1991 | Glezer et al. | 137/13 |
| 5,758,823 A | 6/1998 | Glezer et al. | 239/4 |
| 5,894,990 A | 4/1999 | Glezer et al. | 239/423 |
| 5,914,856 A * | 6/1999 | Morton et al. | 361/690 |
| 5,957,413 A | 9/1999 | Glezer et al. | 244/208 |
| 5,988,522 A | 11/1999 | Glezer et al. | 239/11 |
| 6,056,204 A | 5/2000 | Glezer et al. | 239/8 |
| 6,109,222 A | 8/2000 | Glezer et al. | 123/46 R |
| 6,123,145 A | 9/2000 | Glezer et al. | 165/104.33 |
| 6,247,525 B1 | 6/2001 | Smith et al. | 165/104.25 |
| 6,252,769 B1 * | 6/2001 | Tullstedt et al. | 361/694 |
| 6,412,732 B1 | 7/2002 | Amitay et al. | 244/208 |
| 6,457,654 B1 | 10/2002 | Glezer et al. | 239/4 |
| 6,554,607 B1 | 4/2003 | Glezer et al. | 431/1 |
| 6,588,497 B1 | 7/2003 | Glezer et al. | 165/84 |
| 6,631,077 B2 * | 10/2003 | Zuo | 361/699 |
| 6,644,598 B2 | 11/2003 | Glezer et al. | 244/208 |
| 6,650,542 B1 * | 11/2003 | Chrysler et al. | 361/699 |
| 6,801,430 B1 * | 10/2004 | Pokhama | 361/695 |
| 2003/0142479 A1 * | 7/2003 | Ganrot | 361/719 |
| 2004/0231341 A1 * | 11/2004 | Smith | 62/6 |

OTHER PUBLICATIONS

U.S. Patent Application, "Airfoil Performance Modification Using Synthetic Jet Actuators," filed Oct. 31, 2005, Serial No. to be assigned; filed under US Express Mail No. EV69613606.

U.S. Appl. No. 11/205,665, "Apparatus and Method for Enhanced Heat Transfer," filed Aug. 17, 2005.

* cited by examiner

*Primary Examiner*—Teresa J. Walberg
(74) *Attorney, Agent, or Firm*—John A. Fortkort; Fortkort & Houston P.C.

(57) ABSTRACT

One embodiment of the cooling module is implemented as a device having a heat sink and an integrated synthetic jet actuator. The heat sink is configured to have a channel and a jet distribution system associated with the synthetic jet actuator directs fluid flow into the channel of the heat sink. In operation, the fluid flow of this embodiment of the cooling module comprises a synthetic jet stream and ambient fluid entrained into the channel by the synthetic jet stream. The fluid flowing through the channel serves to a wall of the heat sink channel.

31 Claims, 15 Drawing Sheets

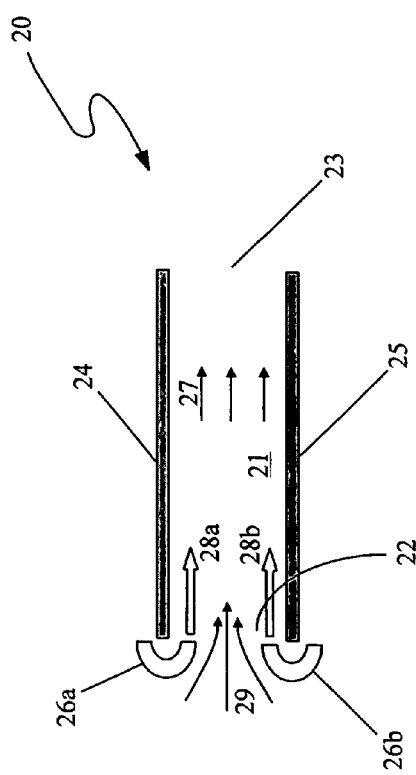
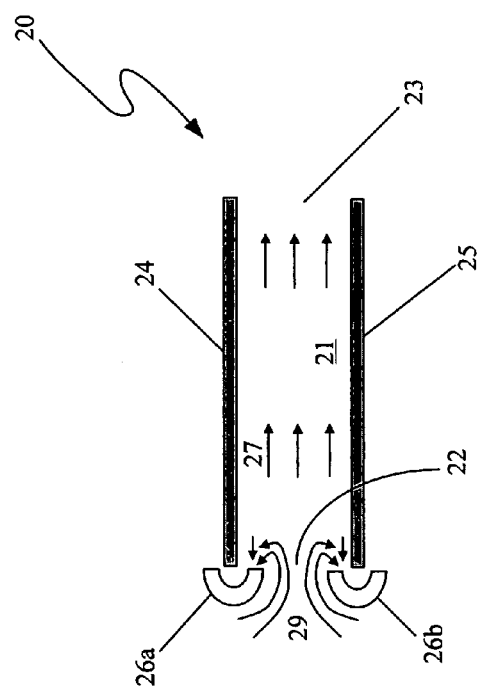
Fig. 2A
Fig. 2B

APPARATUS AND METHOD FOR ENHANCED HEAT TRANSFER

CLAIM TO PRIORITY

The present application claims the benefit of the filing date of U.S. Provisional Patent Application Ser. No. 60/607,187 filed on Sep. 3, 2004, which is hereby incorporated by reference herein.

BACKGROUND

1. Technical Field

The present invention is generally related to thermal management technology and, more particularly, is related to an apparatus and method for cooling heat-producing bodies or components using an integrated cooling module.

2. Description of the Related Art

Cooling of heat-producing bodies is a concern in many different technologies. Particularly in microprocessors, the rise in heat dissipation levels accompanied by a shrinking thermal budget has resulted in the need for new cooling solutions beyond conventional thermal management techniques. This has led to an increased demand for advanced and robust cooling solutions with severe volume constraints. In the microelectronics industry, for example, advances in technology have brought about an increase in transistor density and faster electronic chips. As electronic packages increase in speed and capability, the heat flux that must be dissipated to maintain reasonable chip temperatures has also risen. Thermal management is recognized as a major challenge in the design and packaging of state-of-the-art integrated circuits in single-chip and multi-chip modules.

While air-cooling under natural convection conditions is the simplest possible way to cool a high heat flux device, high power dissipation requirements often necessitate the use of fans. Typically, these fans are placed either directly on a heat sink or are positioned to drive airflow through the heat sink by way of a duct in the heat sink. While fans have the capacity to move a substantial volume of air, they are noisy, unreliable and generally very inefficient in terms of the heat removed for a given rate of fluid flow.

Arrays of air-jets have also been used in cooling applications as an alternative to fans. However, conventional air-jets are not very useful for consumer products, due to requirements of pressure supplies and conduits for directing the air to the heat sink. This makes design of the cooling system too complex and the cost of the cooling system too high for consumer product applications.

Another method of cooling that has been explored involves the use of synthetic jet actuators to form what is known as a synthetic jet, or a synthetic jet stream of fluid. Synthetic or "zero-mass" jets derive their name from the fact that they are synthesized without injection of mass into the system and are comprised entirely of the ambient fluid. This lends them a simplicity that cannot be achieved with conventional unsteady blowing systems.

Although there has been some research into using synthetic jet actuators in cooling applications, the concept of using synthetic jets for heat transfer is relatively new. For example, in an effort to remedy some of the limitations of previous cooling techniques, the use of synthetic or "zero-net-mass-flux" jets in thermal management is discussed in U.S. Pat. No. 6,123,145. U.S. Pat. No. 6,123,145 is hereby incorporated by reference in its entirety, as if fully set forth herein.

As a further example of the development of thermal management techniques with synthetic jet actuators, an apparatus and device for effective channel cooling has been developed. This apparatus and method is described in U.S. Pat. No. 6,588,497, which is hereby incorporated by reference in its entirety, as if fully set forth herein. However, only some of the vast potential for synthetic jets in cooling applications has been explored.

A heretofore unaddressed need exists in the industry to address the aforementioned deficiencies and inadequacies.

SUMMARY

Embodiments of the present invention provide a system and method for cooling heated bodies and environments by using an integrated cooling module.

Briefly described, in architecture, one embodiment of the device described herein, among others, can be implemented as a cooling module having a heat sink. The heat sink is preferably configured to have a channel in the heat sink. The module also has a synthetic jet actuator integrated with the heat sink. The synthetic jet actuator is designed to generate a fluid flow. Finally, the module includes a jet distribution device associated with the synthetic jet actuator. The distribution device directs the fluid flow such that it flows in the channel of the heat sink.

Embodiments of the present invention can also be viewed as providing methods for cooling. In this regard, one embodiment of such a method, among others, can be broadly summarized by the following steps: (i) providing a heat sink structure, where the heat sink structure has a passage; (ii) generating a synthetic jet stream in the heat sink passage; (iii) entraining an ambient fluid into the heat sink passage with the synthetic jet stream such that a flow of ambient fluid is formed in the heat sink passage; and (iv) cooling a wall of the heat sink passage as a result of the flow of the ambient fluid in the passage.

Other devices, systems, methods, features, and advantages of the present invention will be or become apparent to one with skill in the art upon examination of the following drawings and detailed description. It is intended that all such additional devices, systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 2A is a cut-away side view of a jet ejector having synthetic jet actuators in a blowing phase;

FIG. 2B is a cut-away side view of a jet ejector having synthetic jet actuators in a suction phase;

DETAILED DESCRIPTION OF THE PREFERRED EMBODIMENT

The present disclosure is directed to a method and apparatus for heat transfer. The cooling method and apparatus described herein generally use an active cooling module, where the module generally comprises an integrated heat sink and a synthetic jet actuator.

Construction of a Synthetic Jet Actuator

Figure 1:
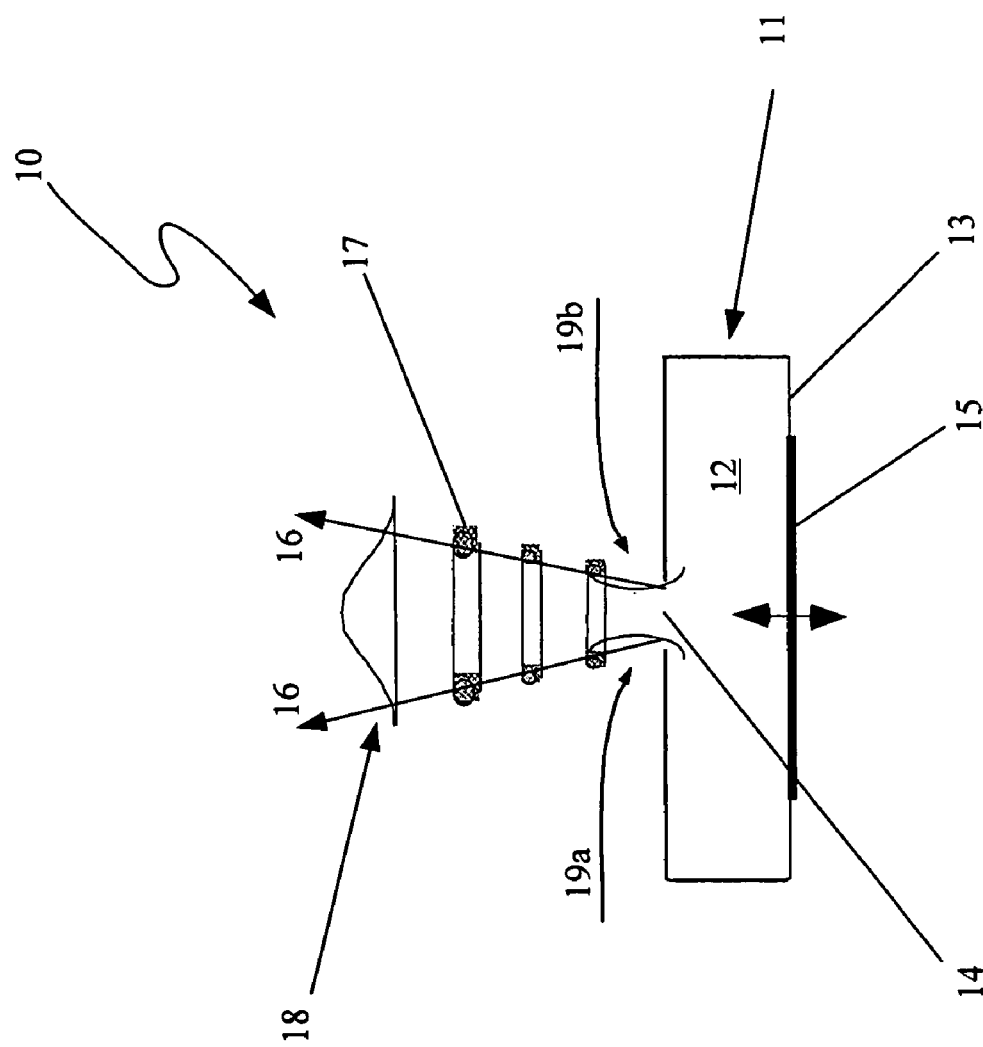
FIG. 1 is a cut-away side view of a synthetic jet actuator.

As noted above, one method of cooling heated bodies and environments that has been explored involves the use of synthetic jet actuators to form a synthetic, or zero-net-mass, jet stream of fluid. A typical synthetic jet actuator 10 is depicted in FIG. 1. A synthetic jet actuator 10, unlike a conventional jet, requires no net mass addition to a system. As depicted in FIG. 1, a synthetic jet actuator 10 generally comprises a housing 11 enclosing a volume of a fluid 12. The synthetic jet actuator 10 also comprises a flexible diaphragm 13 or other mechanism for changing an internal volume of the housing 11. As shown in FIG. 1, the flexible diaphragm 13 may actually comprise a wall of the housing 11. In addition, the diaphragm 13 is affixed with some actuation hardware 15, such as a piezoelectric actuator. The housing 11 of the synthetic jet 10 also typically comprises an orifice 14 such as to permit the air 12 (or other fluid) in the housing 11 to pass into and out of an ambient environment.

The synthetic jet actuator 10 of FIG. 1 forms a synthetic jet of fluid by the periodic ejection of fluid 12 out of the orifice 14. Basically, the diaphragm 13 oscillates periodically, drawing fluid 12 into and ejecting fluid 12 from the housing 11. As the diaphragm 13 moves away from an interior of the housing 11, the volume of the housing 11 increases. This draws ambient fluid 12 into the housing 11, as depicted in FIG. 1 by arrows 19a, 19b. Then, as the diaphragm moves into an interior of the housing 11, thereby decreasing the housing volume, fluid 12 is ejected from the housing 11 as a jet 16 of fluid 12. As the diaphragm 13 oscillates in periodic motion, a synthetic jet 16 is formed and maintained.

FIG. 1 also depicts a schematic of a Schlieren image 18 of a cross-section of a synthetic jet 16. One characteristic of the jet 16 formed in the manner mentioned above is the presence of coherent vortical structures 17, which eventually merge into the turbulent jet 16. These vortices 17 act to entrain the ambient fluid and use the ambient fluid to actually form the jet 16. Thus, the jet 16 not only consists of fluid 12 ejected from the housing 11, but also comprises ambient fluid entrained by the action of the vortices 17 rolling up at an edge of the orifice 14. In the mean, synthetic jets 16 typically resemble steady turbulent jets in the rate of lateral spread and the rate of decay of the peak centerline velocity.

This is certainly not the only way to build a synthetic jet actuator, or to form a synthetic jet stream. Indeed, synthetic jet actuators, generally, are described in detail in U.S. Pat. No. 5,758,853 to Glezer et al., entitled "Synthetic Jet Actuators and Applications Thereof," which is incorporated herein by reference. Other embodiments of synthetic jet actuators, as well as various applications of synthetic jet actuators, are discussed in U. S. Pat. No. 5,894,990 to Glezer et al., U.S. Pat. No. 6,123,145 to Glezer et al., U.S. Pat. No. 6,056,204 to Glezer et al., U.S. Pat. No. 5,988,522 to Glezer et al., U.S. Pat. No. 5,957,413 to Glezer et al., U.S. Pat. No. 6,457,654 to Glezer, et al., and U.S. Pat. No. 6,554,607 to Glezer, et al., all of which are hereby incorporated by reference as if fully set out herein.

Construction of a Jet Ejector

Due to the unique characteristics of synthetic jet actuators 10, they can be used to create cooling flows in a variety of applications. One such application is in the creation of what is known as a jet ejector. Conventional jet ejectors simply use ordinary, non-synthetic jets to drive a fluid flow in a channel. However, such conventional jet ejectors require the use of a pressure source ducted to the channel.

FIG. 2A depicts an embodiment of a jet ejector 20 using synthetic jet actuators. The basic structure of the jet ejector 20 comprises a channel 21 having a first opening 22 and a second opening 23. The channel 21 is depicted in cross-section in FIG. 2A; therefore, the channel 21 is depicted as having a top wall 24 and a bottom wall 25 only. Of course, if the channel 21 is enclosed, the two walls 24, 25 are connected to form a closed channel 21. It is not required that the channel 21 of the jet ejector 20 be either open or closed. In addition, a jet ejector 20 does not necessarily require a channel 21 of a specific cross-section.

The creation of a jet ejector 20 also does not necessary require a channel 21, per se. A jet ejector 20 could simply be constructed in a duct or passageway, for example. A jet ejector 20 can be set up to operate in an fluid-conducting passage, whatever form that passage may take.

The jet ejector 20 also comprises two synthetic jet actuators 26a, 26b. The synthetic jet actuators 26a, 26b of the jet ejector 20 are positioned at the first opening 22 of the channel 21. It is not required that the synthetic jet actuators 26a, 26b be positioned at the first opening 22 of the channel 21. Indeed, the synthetic jet actuators 26a, 26b could be positioned anywhere in the channel 21 of the jet ejector 20. The synthetic jet actuators 26a, 26b could even be positioned within the channel 21 to form a jet ejector 20. In addition, a jet ejector 20 could employ numerous synthetic jet actuators positioned along an entire length of the channel 21.

The synthetic jet actuators 26a, 26b of the jet ejector 20 may be constructed in a variety of manners. As noted above, and in the incorporated U.S. Patents, there are numerous ways to construct and create a synthetic jet. A jet ejector 20 could use any of these, depending on the application of the jet ejector 20.

In operation, the jet ejector 20 is designed to have a fluid flow 27 through the channel 21. The operation of the synthetic jet actuators 26a, 26b creates the fluid flow 27 in the jet ejector 20 of FIG. 2A. Basically, the operation of the synthetic jet actuators 26a, 26b forms primary jets 28a, 28b in the channel 21. These primary jets 28a, 28b drive a secondary airflow 27 through the channel 21 by entraining ambient fluid 29. FIG. 2A depicts the operation of the jet ejector 20 during the blowing stroke of the synthetic jet actuators 26a, 26b. FIG. 2B depicts the operation of the jet ejector 20 during the suction stroke of the synthetic jet actuators 26a, 26b. As will be noted from the figures, the fluid flow 27 continues through the channel 21 during both phases of synthetic jet actuator 26a, 26b operation.

During the blowing stroke of synthetic jet actuators 26a, 26b (shown in FIG. 2A), the jet ejector phenomenon is similar to a jet ejector using traditional fluidic jets, wherein a primary high momentum jet 28a, 28b creates a low pressure in a channel 21 resulting in the entrainment of fluid 29 from the secondary quiescent medium. With the depicted embodiment 20 however, during the suction stroke of the synthetic jet actuators 26a, 26b, the low pressure in the jet chamber results is considerably higher secondary flow entrainment 29 into the channel 21 than could be expected with a traditional fluidic jet. The additional fluid entrained into the channel 21 is forced out during the subsequent blowing stroke of the synthetic jet actuators 26a, 26b. This action results in a great flow through the channel 21 than could be achieved with traditional jets.

The use of synthetic jet actuators 26a, 26b as the primary jet in a jet ejector 20 is also an attractive option since the only input to the synthetic jets is electrical, requiring no plumbing and pressure supplies. Also, synthetic jets 26a, 26b are attractive due to the ease of incorporating a jet module in low-profile compact geometries.

The concept and design of the jet ejector 20 can have application in a variety of cooling modules.

Construction of an Active Cooling Module

Figure 3:
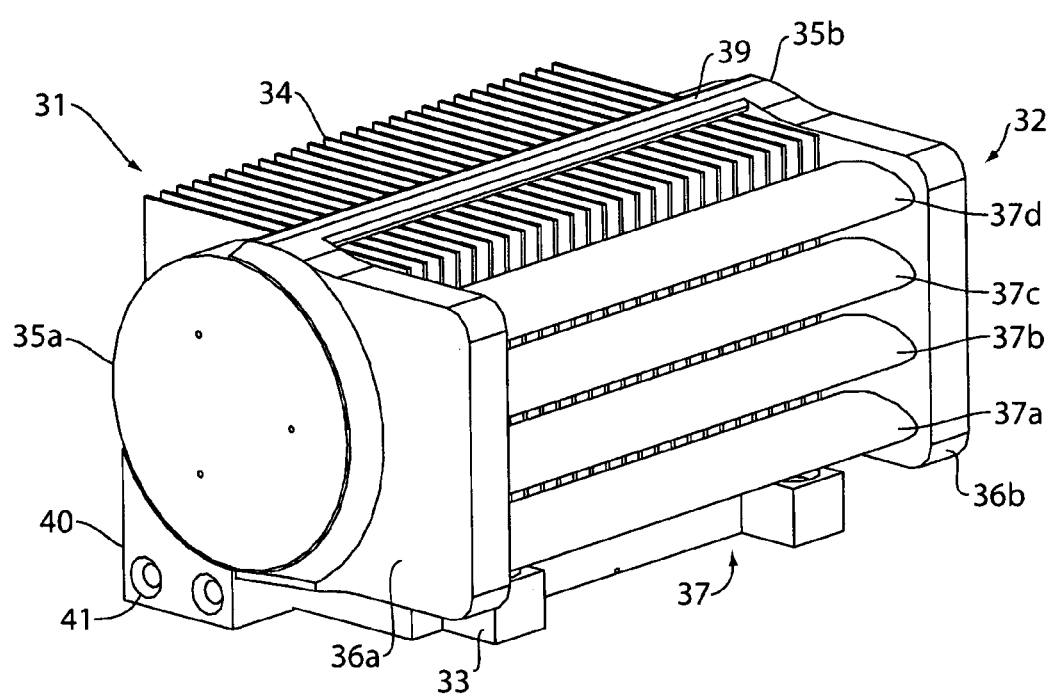
FIG. 3 is a perspective view of a first embodiment of a cooling module.

A first embodiment of a cooling module 30 is depicted in FIG. 3. The cooling module 30 generally comprises a heat sink 31 and a synthetic jet matrix 32. The present embodiment of a cooling module 30 uses the concept of a jet ejector 20 in order to cool the heat sink 31, which, in turn, can be used to cool a heated body or environment.

The heat sink 31 of the first embodiment 30 is constructed of aluminium due to the relatively high thermal conductivity of aluminium. Alternatively, the heat sink 31 could be constructed from many other types of material, for example copper or a copper-aluminium combination, depending on the particular application of the module 30. Typically, it is preferred that the material of the heat sink 31 be capable of effectively conducting thermal energy, e.g. heat.

As depicted in FIG. 3, the heat sink 31 of the present embodiment is generally manufactured into a structure having a base 33 and a number of fins 34 extending from the heat sink base 33. As will be recognised by those with skill in the art, the heat sink 31 depicted in FIG. 3 has a typical design for a heat sink. It is common for heat sinks to comprise both a base to be positioned near a heated body and a series of fins to more effectively dissipate the thermal energy absorbed by the heat sink. Of course, there are other alternative embodiments of a heat sink 31 that would be equally well suited to function with the module 30 described herein. One having ordinary skill in the art would easily be able to select an alternative heat sink 31 design, if desired, after reading the present description and disclosure.

As noted above, the heat sink 31 of the present embodiment 30 is configured to be integrated with a synthetic jet matrix 32. Preferably, though not required, the synthetic jet matrix 32 is formed with stereolithography from a plastic material. Plastic is the preferred material for the synthetic jet matrix 32 because of the ease with which the matrix 32 can be manufactured from plastic. Plastic is also a relatively low-cost material. However, the synthetic jet matrix 32 of the present embodiment 30 is not limited to only being constructed from plastic. In fact, many types of materials would be appropriate for the manufacture and construction of the synthetic jet matrix 32.

As depicted in FIG. 3, the synthetic jet matrix 32 of the present embodiment 30 generally comprises two actuator housings 35a, 35b, two connecting chambers 36a, 36b, and a jet distribution system 37. In the depicted embodiment 30, the jet distribution system 37 comprises four tubular plenums 38a, 38b, 38c, 38d. As shown, the plenums 38a, 38b, 38c, 38d each have two ends fluidically connected to each of the two connecting chambers 36a, 36b.

In fact, all of the primary elements of the synthetic jet matrix 32 are in fluid communication. Each of the two actuator housings 35a, 35b are connected to their adjacent the connecting chambers 36a, 36b, which in turn, are connected to the four plenums 38a, 38b, 38c, 38d of the present embodiment 30.

The embodiment 30 depicted in FIG. 3 also comprises an actuator base structure 40 adjacent to each actuator housing 35a, 35b for connecting the synthetic jet matrix 32 to the heat sink 31. Typically, the synthetic jet matrix 32 is connected to the heat sink 31 with screws 41 or another similar attachment mechanism. A supporting member 39 is also constructed in order to lend additional structural rigidity to the depicted embodiment 30. The supporting member connects each of the connecting chambers 36a, 36b by spanning across a top portion of the fins 34 of the heat sink 31. Neither the supporting structure nor the attaching structure 39, 40 just described is required in the present embodiment 30, and in fact, may not be desired in some applications. For instance, it may be desirable to have the synthetic jet matrix 32 more easily removable from the heat sink 31. Such an alternative embodiment would not join the synthetic jet matrix 32 to the heat sink 31 with screws or the like. One of skill in the art will be able to make such an elementary design decision after reading the present description and disclosure.

Figure 4:
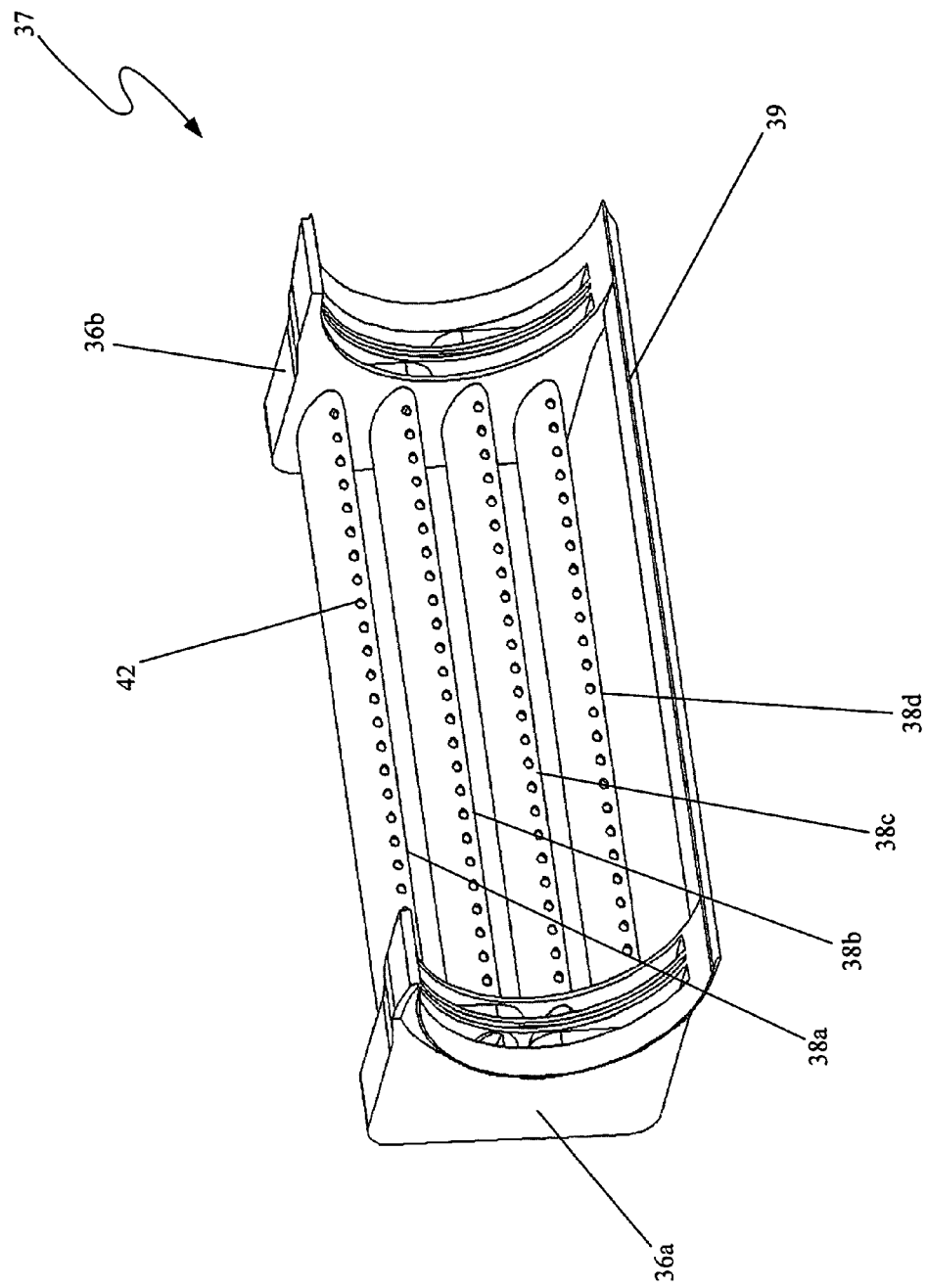
FIG. 4 is a perspective view of a jet distribution system of the first embodiment of a cooling module depicted in FIG. 3.

The connecting chambers 36a, 36b and the jet distribution system 37 are depicted separately and in more detail in FIG. 4. FIG. 4 is a perspective front view of these elements of the synthetic jet matrix 32. As noted above, the jet distribution system 37 of the present embodiment 30 comprises four tubular plenums 38a, 38b, 38c, 38d. Each plenum 38a, 38b, 38c, 38d is hollow and has a number of orifices 42 cut into a wall of each plenum 38a, 38b, 38c, 38d. As can be seen, the orifices 42 generally form a line of holes along the length of each tube 38a, 38b, 38c, 38d. The tubes 38a, 38b, 38c, 38d are designed such that a fluid can be carried from the connecting chambers 36*a*, 36*b*, through the plenum structures 38*a*, 38*b*, 38*c*, 38*d* and out the orifices 42.

As depicted in FIG. 4, the connecting chambers 36*a*, 36*b* are designed to connect with the actuator housings 35*a*, 35*b* in such a manner as to permit fluid to flow from the actuator housings 35*a*, 35*b* to the connecting chambers 36*a*, 36*b*, and vice-versa. As also depicted in FIG. 4, the connecting chambers 36*a*, 36*b* are designed such as to distribute and control the fluid flowing from the actuator housings 35*a*, 35*b* to the plenums 38*a*, 38*b*, 38*c*, 38*d* and vice-versa. The specific distribution mechanism in the connecting chambers 36*a*, 36*b* is not critical to the present embodiment 30. However, it is usually desirable to adjust the distribution of fluid flowing through the connecting chambers 36*a*, 36*b* such that the flow rate of the fluid flowing into and out of the orifices 42 is relatively equal. This, of course, is not required and may not even be desirable in some applications. Indeed, the connecting chambers 36*a*, 36*b* can be designed such as to deliver more or less fluid flow to and from different plenums, if differing flow rates through different orifices 42 are desired.

Figure 5:
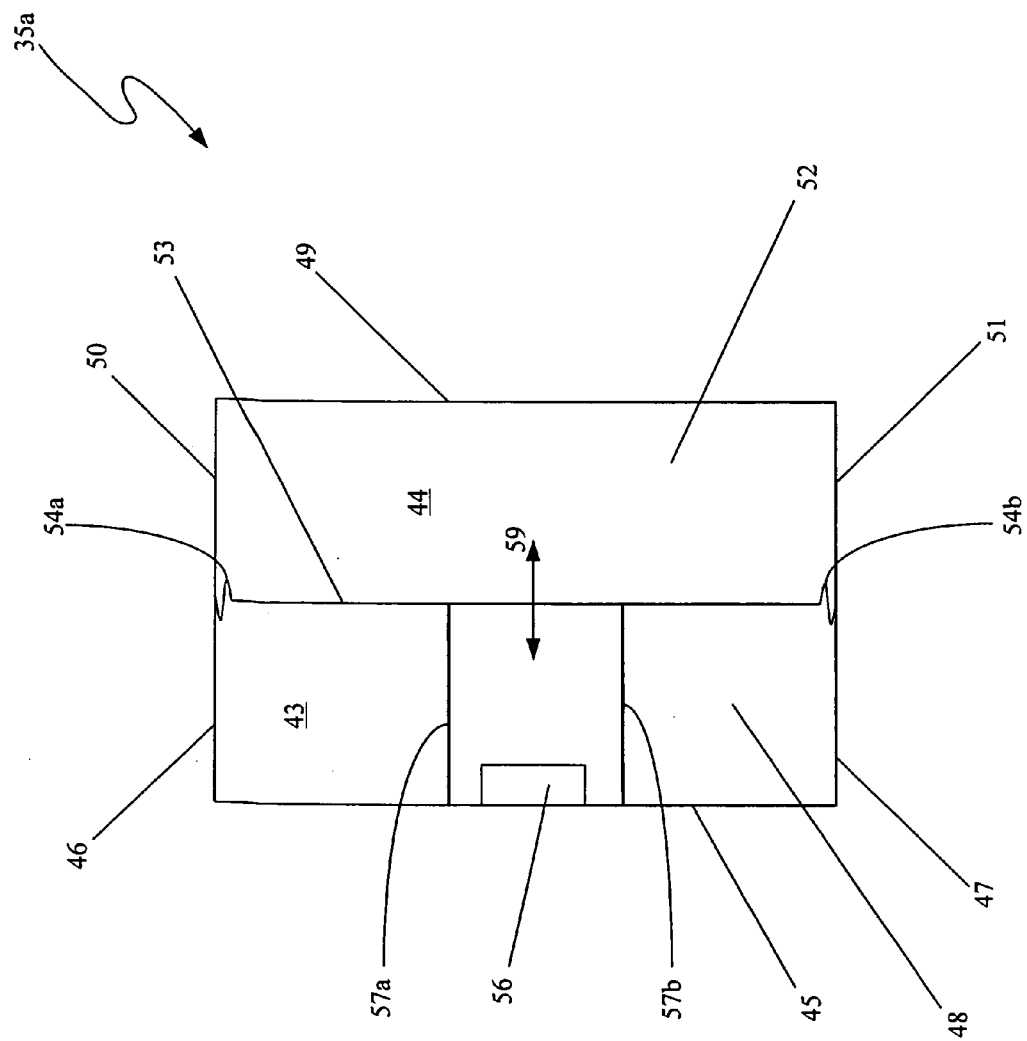
FIG. 5 is a front view of a synthetic jet actuator housing of the first embodiment of a cooling module depicted in FIG. 3.

One of the actuator housings 35*a* of the synthetic jet matrix 32 is depicted in more detail in FIG. 5. The actuator housing 35*a* in FIG. 5 is depicted from a front view such that the portion of the actuator housing 35*a* facing the page is the portion that attaches to the connecting chamber 36*a*. The attachment of the actuator housing 35*a* to it adjacent connecting chamber 36*a* can be more clearly seen in FIG. 3. The actuator housing 35*a* of FIG. 5 generally comprises a housing forming two chambers 43, 44 that can be referred to as a first chamber 43 and a second chamber 44. The first chamber 43 has a left wall 45, a top wall 46, a bottom wall 47 and a back wall 48. The left wall 45 is the "exterior" wall of the actuator housing 35*a* clearly seen in FIG. 3. As just noted, the area facing the page is open and connects the actuator housing 35*a* to the connecting chamber 36*a* depicted in FIG. 4. The second chamber 44 similarly comprises a right wall 49, a top wall 50, a bottom wall 51 and a back wall 52. As with the first chamber 43, the area of the second chamber 44 facing the page is open and connects the actuator housing 35*a* to the connecting chamber 36*a* depicted in FIG. 4.

As shown in FIG. 5, the two actuator chambers 43, 44 share a common center wall 53. This wall 53 preferably comprises a rigid, but moveable, piston-like structure, though as will be discussed below, such a structure is not required. This piston is preferably constructed of a rigid, lightweight material, though this is not required. In addition, because the preferred embodiment of the center wall 53 is a moveable piston, this wall 53 is preferably not rigidly connected to the other walls of the actuator housing 35*a*. Rather, the piston 53 is connected to the top walls 46, 50, bottom walls 47, 51, and back walls 48, 52 by a rolling diaphragm seal 54*a*, 54*b*.

Figure 6:
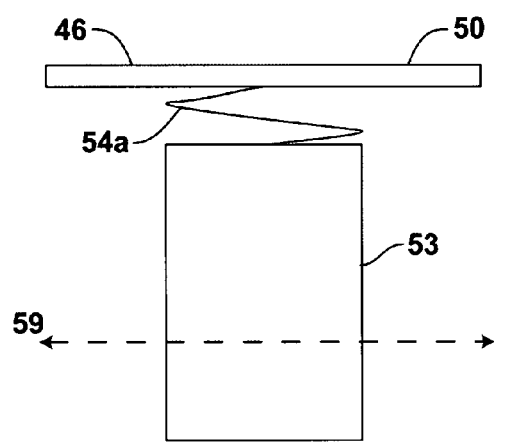
FIG. 6 is a magnified cut-away side view of a piston sealing mechanism of FIG. 5.

The manner in which the piston wall 53 is connected to the other walls of the actuator housing 35*a* is depicted in more detail in FIG. 6. FIG. 6 is a close-up view of the top portion of the center wall 53 more specifically showing its connection to the top walls 46, 50 of the actuator housing 35*a*. As shown in FIG. 6, the rolling seal 54*a* is basically a piece of flexible material attached to both the piston wall 53 and the surrounding walls 46, 50. In addition, in the preferred embodiment, the rolling seal 54*a*, 54*b* is made with more material than is necessary to simply join the piston wall 53 to the surrounding walls 46, 50. In this manner, a seal is maintained such that fluid does not flow around the piston wall 53 and between the two chambers 43, 44. Yet, because of the extra material in the rolling diaphragm seal 54*a*, the piston wall 53 is permitted to move roughly horizontally into and out an interior area of both chambers 43, 44.

Figure 7:
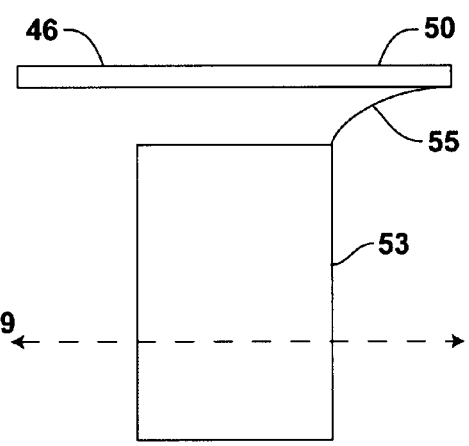
FIG. 7 is a magnified cut-away side view of an alternative embodiment of a piston sealing mechanism of FIG. 6.

Alternatively, the piston wall 53 of a cooling module 30 according to the present description is not required to be attached to the other walls of the actuator housing 35*a* as depicted in FIG. 6. In such an embodiment, the piston 53 is attached to the actuator housing walls by a simple diaphragm seal 55, as depicted in FIG. 7. With less diaphragm material, the diaphragm material is generally preferred to be flexible. Motion of the piston wall 53 is permitted due to the flexibility of the diaphragm seal 55. However, the piston 53 is constrained in its horizontal travel by the limited amount of material used for the seal 55.

Figure 8:
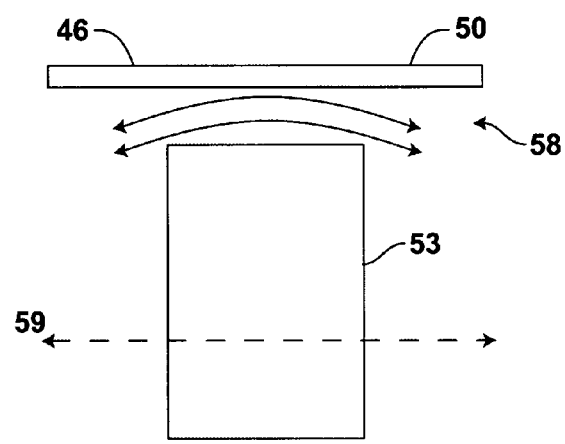
FIG. 8 is a magnified cut-away side view of an alternative embodiment of a piston sealing mechanism of FIG. 6.

On the other hand, in another alternative embodiment, the piston wall 53 is not attached at all to any of the walls of the actuator housing 35*a*. As depicted in FIG. 8, the piston wall 53 is manufactured close enough to the surrounding housing walls 46, 50 to form a type of "viscous seal." In this way, a "slug" of fluid 58 impeded by the high pressure drop between the two chambers 43, 44 restricts flow of fluid around the edge of the piston wall 53. Of course, depending on the machining tolerances of the cooling module 30, there may be some fluid that flows between the two chambers 43, 44 as the piston 53 moves horizontally. However, the amount of fluid changing chambers may prove negligible enough to be of little concern in certain applications.

As another alternative embodiment, it is not required in the synthetic jet matrix 32 to have a rigid piston wall 53 separating the two chambers 43, 44. Indeed, in another alternative embodiment, the actuator housings 35*a*, 35*b* are configured to use flexible diaphragms as the common wall between the chambers 43, 44 in the actuator housings 35*a*, 35*b*.

In another alternative embodiment, the actuator housings 35*a*, 35*b* are constructed to have more than two internal chambers (not depicted). With the cooling module 30 described herein, any number of chambers may be used in the actuator. As will be readily understood by one having skill in the art, this alternative embodiment also comprises more than one piston wall.

Returning to FIG. 5, the actuator housing 35*a* also comprises actuation hardware in the form of a magnet 56 affixed to the side wall 45 of the first chamber 43 and in the form of two current-carrying coils 57*a*, 57*b*. As will be recognized by one of skill in the art, these elements of the actuation hardware comprise the fundamental elements of an electromagnetic actuation mechanism.

In operation, the electromagnetic actuation system depicted in FIG. 5 functions due to the interaction between the magnet 56 and the current-carrying coils 57*a*, 57*b* as current is caused to flow through the coils 57*a*, 57*b*. As depicted, the magnet 56 is preferably attached to the side wall 45 of the first chamber 43. The coils 57*a*, 57*b* are flexible and act similar to two springs in that they permit the piston wall 53 to move both toward and away from the magnet 56, as depicted by arrow 59. To actuate the piston wall 53, current is caused to flow through the coils 57*a*, 57*b* and due to the electromagnetic interaction with the magnet 56, the coils expand and contract periodically. This moves the piston wall 53 toward and away from the side walls 45, 49 in periodic motion. Consequently, the piston 53 periodically forces fluid out of the first chamber 43 (while drawing fluid into the second chamber 44) and into the first chamber 43 (while expelling fluid from the second chamber 44). The operation of the present embodiment will be discussed in greater detail below.

Of course, electromagnetic actuation is not required in the first embodiment 30. In an alternative embodiment, a piezoelectric actuator is used to cause the piston wall 53 to move in periodic motion. In another alternative embodiment, other configurations of electromagnetic actuators could be used for driving the piston 53. For example, in one alternative embodiment, the magnet 56 is attached to the piston 53 itself and the coils 57a, 57b are fashioned as attached to the side wall 45 only. Again, as current is passed through the coils 57a, 57b, the magnet 56 is alternatively repelled from and attracted to the side wall 45.

Generally, the electromagnetic actuation system depicted in FIG. 5 is controlled by a control system (not depicted) in order to cause the piston 53 to move periodically, and horizontally 59, at a resonant frequency of the synthetic jet matrix 32. The control system consists, generally, of a power supply to the coils 57a, 57b and a signal generator.

The particular resonant frequency of the system is a function of many factors dependent on how the system is manufactured. For example, the resonant frequency of the system is a function of the piston material, the thickness and size of the piston 53, the method of attaching the piston 53 to the other walls, the material used to attach the piston 53 to the other walls, the seal between the various parts of the system, and the like. Because of this, the particular resonant frequency of the system can be controlled in a number of ways. As a non-limiting example, one method of changing the resonant frequency of the system is to change the mass of the rigid piston 53, often accomplished by selecting a different material for the piston wall 53. If the piston 53 is made lighter, for example, this generally increases the resonant frequency of the system and decreases the amount of power needed to operate the system. In fact, it is possible to achieve sub-audible resonant frequencies through the selection of appropriate material for the piston 53, which may be desirable in certain applications. One of skill in the art, after reading this disclosure, will be able to make such a material selection dependant upon the requirements of the specific cooling module 30.

Basically, the two chambers 43, 44 of the actuator housing 35a function similarly to the synthetic jet actuator 10 described above. The piston wall 53 roughly serves the purpose of the diaphragm 13 of the synthetic jet actuator 10 described above.

Obviously, the above discussion has focussed on only one of the actuator housings 35a depicted in FIG. 3. The other actuator housing 35b depicted in the figure has the same internal construction, although this is not necessarily required. As such, the other actuator housing 35b also comprises two chambers. In total, the embodiment 30 depicted in FIG. 3 comprises actuator housings 35a, 35b with four total chambers. Each chamber is connected fluidically to different orifices 42 due to the distribution hardware in the connecting chambers 36a, 36b, discussed above.

Figure 9:
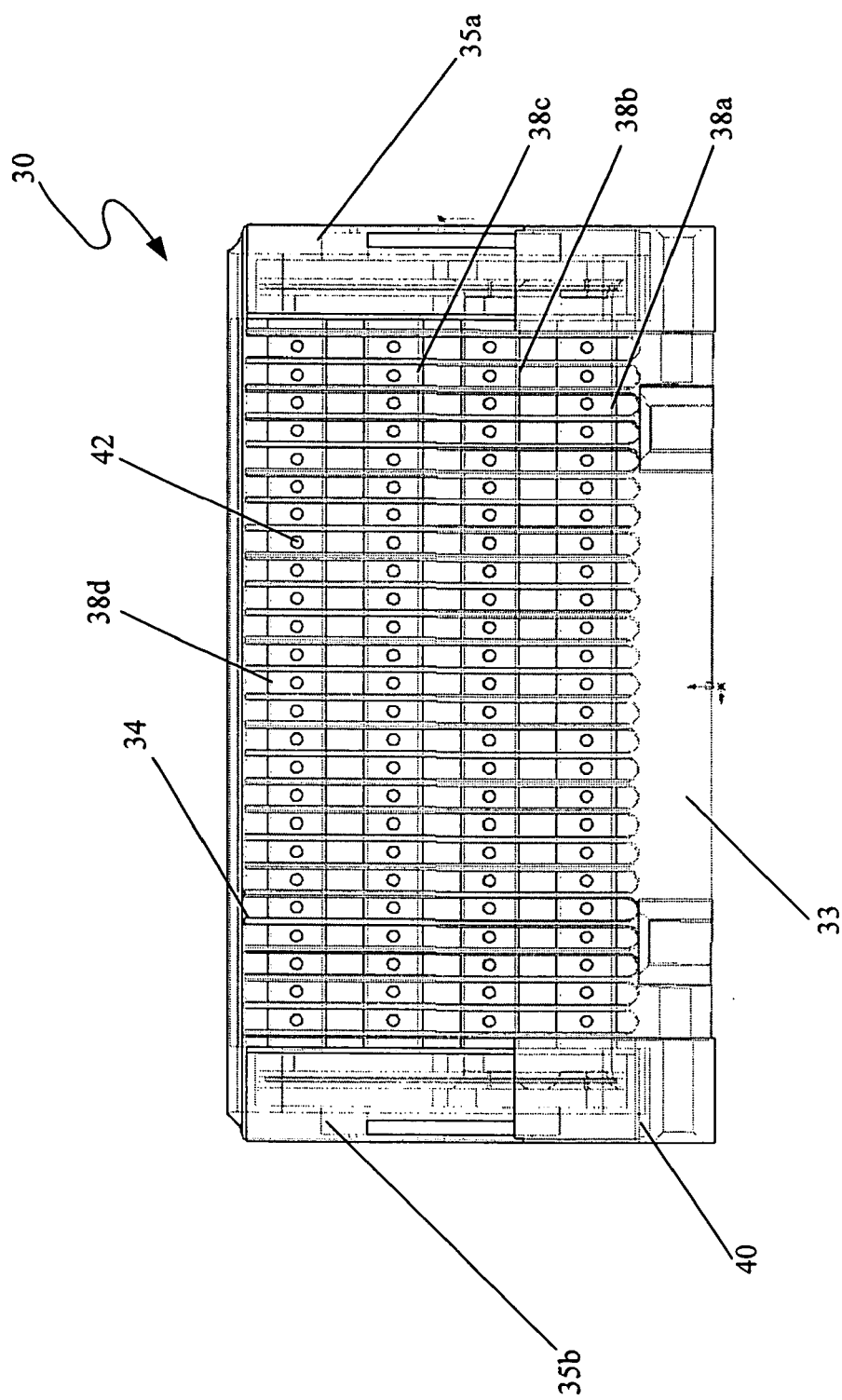
FIG. 9 is a front view of the first embodiment of a cooling module depicted in FIG. 3.

Returning to FIG. 3, the synthetic jet matrix 32 and the heat sink 31 are preferably joined together to form the present embodiment of a cooling module 30. FIG. 9 shows an alternative view of the present embodiment 30. FIG. 9 is a front view of the system 30, which shows how the orifices 42 of the plenums 38a, 38b, 38c, 38d are aligned such as to be positioned to be between adjacent fins 34 of the heat sink 31. The reason for such positioning will be apparent from the discussion of the operation of the cooling module 30, below.

Operation of a First Embodiment of an Active Cooling Module

In operation, the synthetic jet matrix 32 creates the effect of a jet ejector 20, as discussed above in relation to FIGS. 2A and 2B, between adjacent fins 34 of the heat sink 31. Particularly, the control system causes the pistons in the actuator housings 35a, 36b to oscillate in periodic motion. Preferably, though not required, the pistons are caused to oscillate at a resonant frequency of the system 30.

The oscillation of the pistons causes the volumes of the chambers in the actuator housings 36a, 36b to be alternatively increased and decreased. As the chamber volume is increased, fluid is pulled in through the orifices 42 fluidically connected to the specific chamber having its volume increased. Then, as the volume of that chamber is decreased, due to the periodic motion of the piston 53, fluid is ejected from the orifices 42 connected to that chamber such that a synthetic jet stream of fluid is formed at the orifice 42. Basically, the entire synthetic jet matrix 32 functions as a large synthetic jet actuator 10 with the added feature of the jet distribution system 37 to control where the fluid stream is created.

Figure 10:
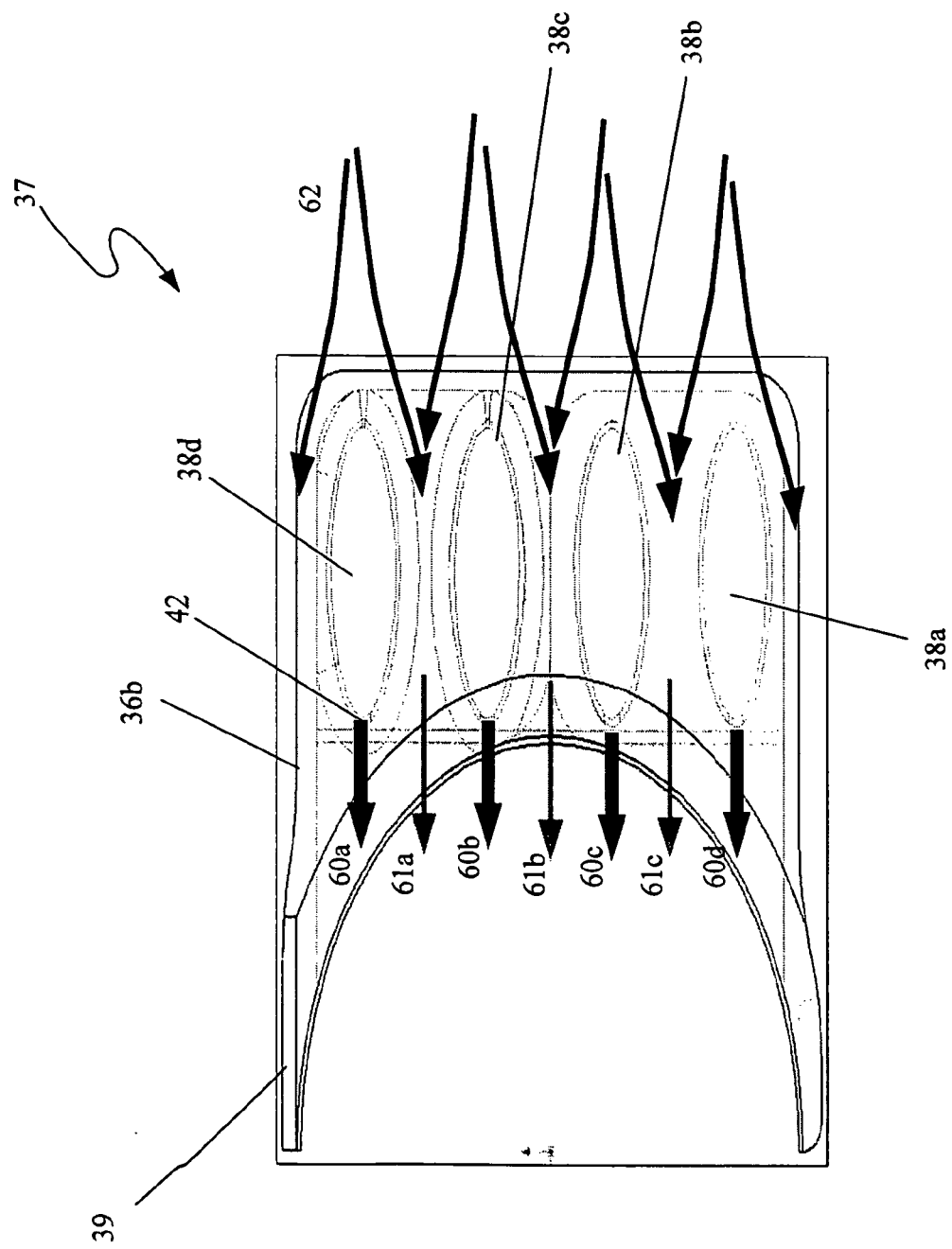
FIG. 10 is a side view of the jet distribution system of FIG. 4 while in operation.

FIG. 10 is a side view of the first connecting chamber 36a and the plenums 38a, 38b, 38c, 38d in operation. The synthetic jet streams 60a, 60b, 60c, 60d of the synthetic jet matrix 32 are depicted as emitting from the orifices 42 in the plenums 38a, 38b, 38c, 38d. These streams 60a, 60b, 60c, 60d are formed between the various fins (not depicted in FIG. 10) of the heat sink 31. As the streams 60a, 60b, 60c, 60d are created, the inherent vorticity of the synthetic jet streams 60a, 60b, 60c, 60d entrain ambient fluid 62 to flow around the tubular plenums 38a, 38b, 38c, 38d and join the synthetic jet streams 60a, 60b, 60c, 60d. As the synthetic jet streams 60a, 60b, 60c, 60d flow down the channels formed by adjacent fins 34, a secondary flow of ambient fluid 61a, 61b, 61c is created, similar to as described above with regard to the jet ejector 20 in FIGS. 2A and 2B. Of course, because the synthetic jet matrix 32 is creating zero net mass flux jets 60a, 60b, 60c, 60d, during the suction phase of the various chambers of the matrix 32, ambient fluid 62 is continued to be pulled from an ambient environment into the channels formed by the fins 34 of the heat sink 31.

Construction of an Alternative Embodiment of an Active Cooling Module

Figure 11:
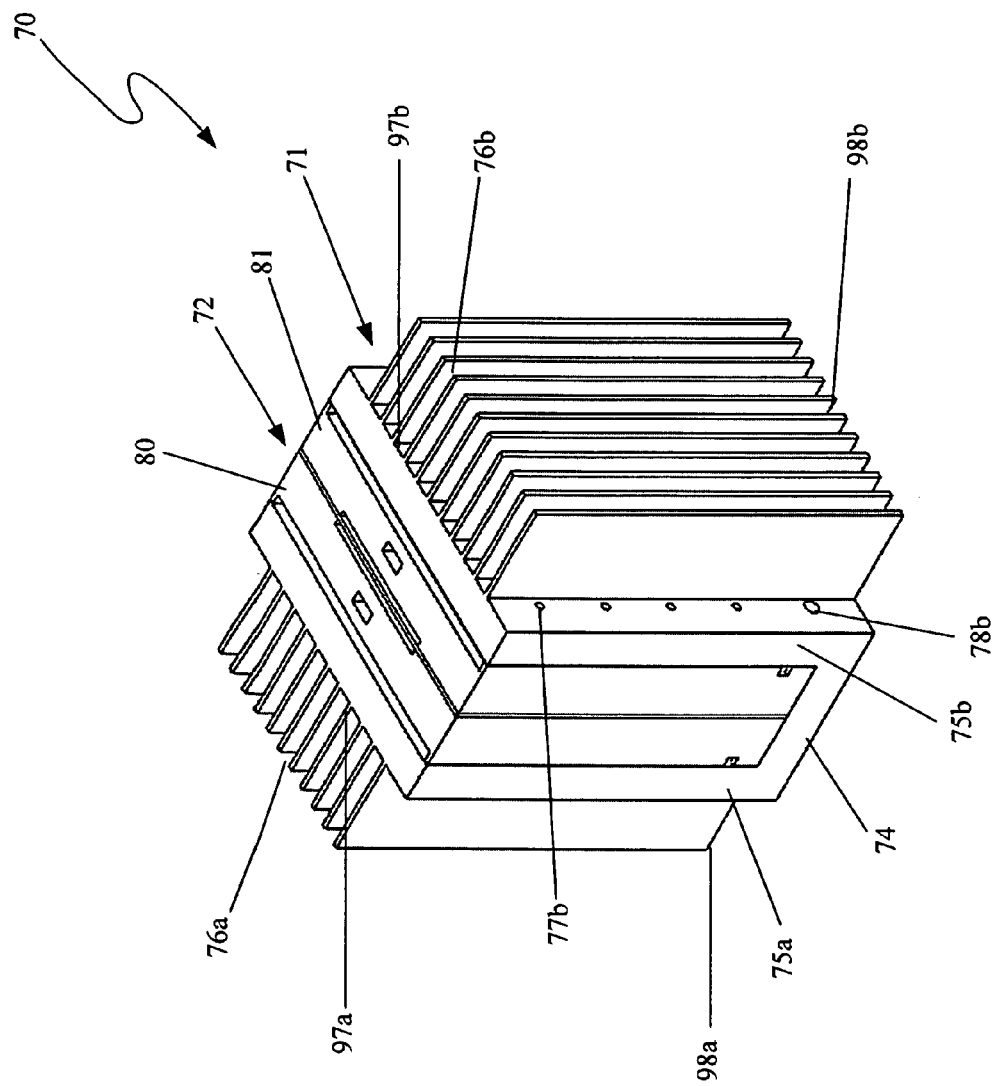
FIG. 11 is a perspective view of an alternative embodiment of a cooling module.

An alternative embodiment of a cooling module 70 is depicted in FIG. 11. This alternative embodiment 70 generally comprises a heat sink 71 and an integrated synthetic jet actuator 72.

The heat sink 71 of the present embodiment 70 is preferably constructed of aluminium due to the relatively high thermal conductivity of aluminium. The heat sink 71 could be constructed from a number of other types of material depending on numerous factors such as the device application, material availability, and manufacturing cost among others. However, it is preferred that the material of the heat sink 71 be a type of material that has the capacity to effectively transfer heat.

Figure 12:
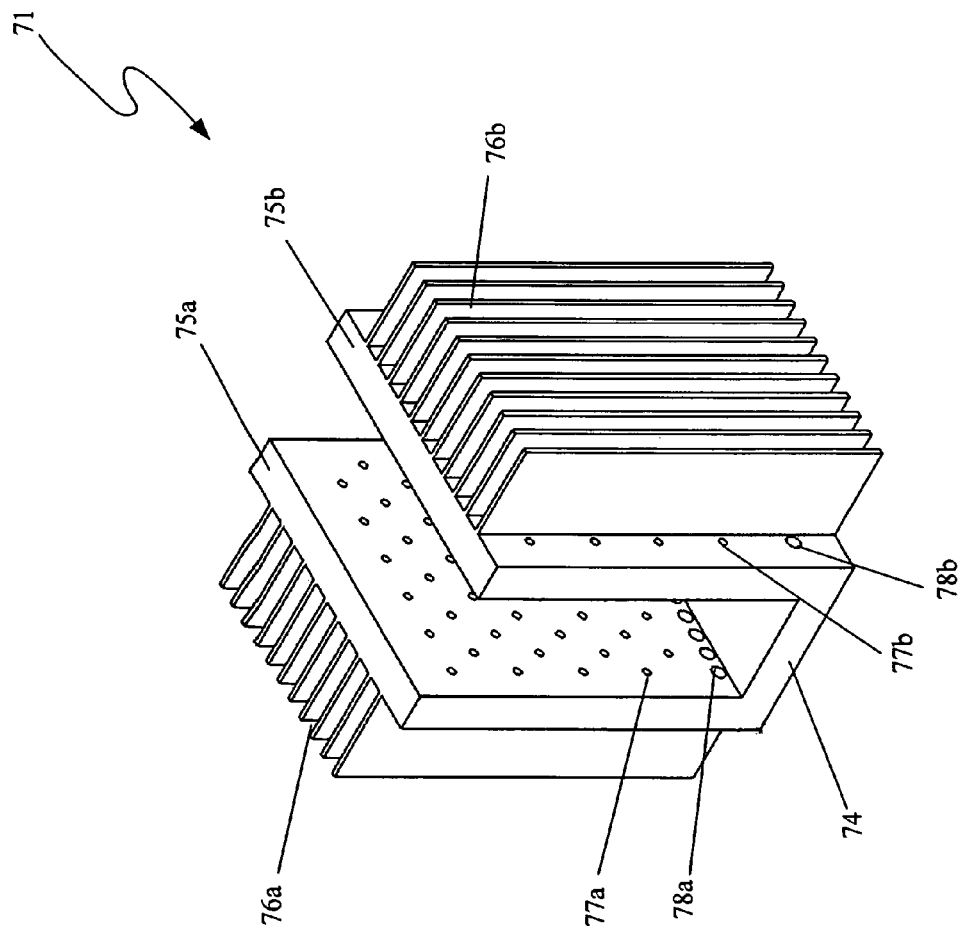
FIG. 12 is a perspective view of a heat sink used in the alternative embodiment of a cooling module depicted in FIG. 11.

The heat sink 71 of the cooling module 70 is depicted in FIG. 12 with the synthetic jet actuator 72 not depicted, in order to more easily describe the components of the heat sink 71. As shown in FIG. 12, the heat sink 71 is generally manufactured into a U-shaped base structure having a bottom portion 74 and two opposing side portions 75a, 75b. The heat sink 71 of the present embodiment 70 also comprises a number of fins 76*a*, 76*b* extending from each of the two opposing side portions 75*a*, 75*b* of the heat sink 71.

The heat sink 71 of the present embodiment 70 has been configured to generally reflect a common heat sink design. As explained above, many heat sinks comprise a base portion and a number of fins. In this way, the base portion is typically positioned near a heated object such as to absorb heat from the object. Because the heat sink is usually typically thermally conductive, the heat absorbed by the base moves into the fins. Once the heat moves into the fins, the high surface area permits easy diffusion of the heat into the ambient environment.

Although the heat sink 71 is similar to a common design, the depicted heat sink 71 is not the only configuration possible with the present embodiment 70. Indeed, there are many other possible designs, as would be readily understood by one having ordinary skill in the art after reading the present description and disclosure.

Another feature of the heat sink 71 is that the two side portions 75*a*, 75*b* have been manufactured with a number of passageways 77*a*, 77*b*. The passageways 77*a*, 77*b* have a first opening to an interior area of the U-shaped heat sink 71 and a second opening to an area between each of the heat sink fins 76*a*, 76*b*. As also depicted in FIG. 12, it is preferred, though not required, that the passageways 78*a*, 78*b* nearest the heat sink base 74 have a larger diameter than the other passageways 77*a*, 77*b*. The purpose for this optional design choice will be discussed in more detail below.

Figure 13:
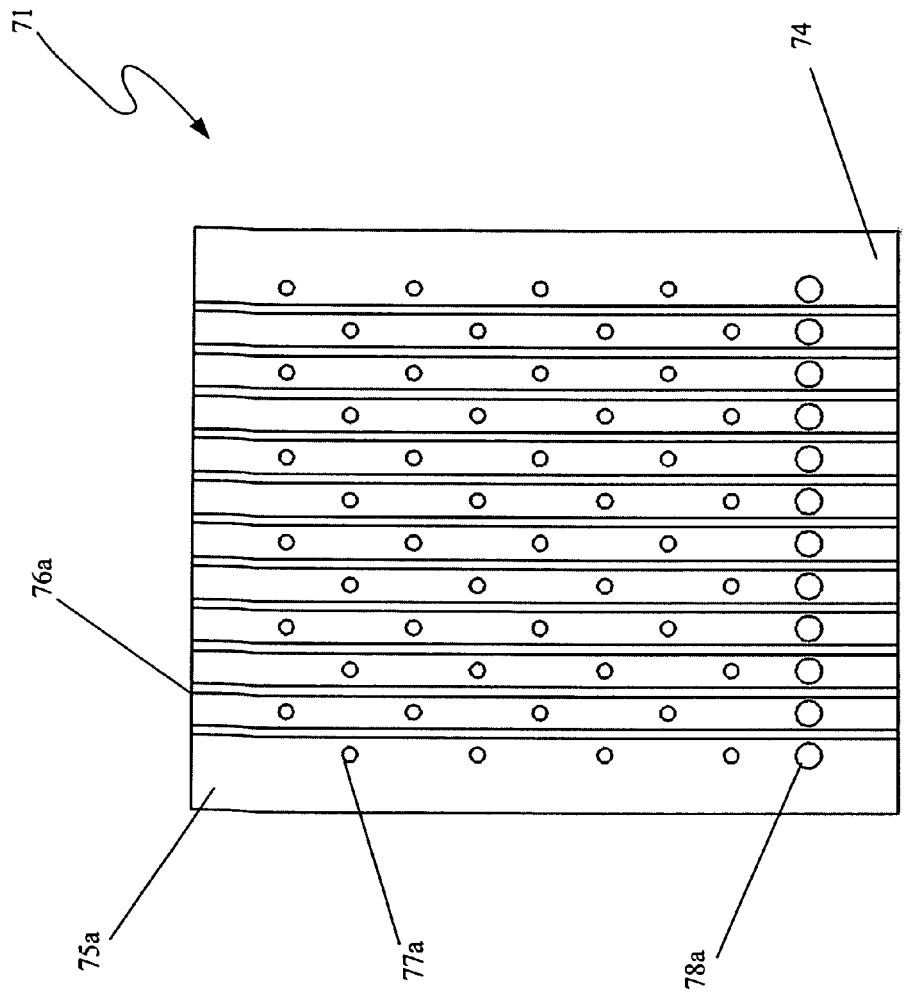
FIG. 13 is a side view of a heat sink used in the alternative embodiment of a cooling module depicted in FIG. 11.

FIG. 13 is a side view of the heat sink 71 depicting one side wall 75*a* of the heat sink 71. The fins 76*a* are depicted from an outer edge of the fin. The passageways 77*a* are also depicted in this view. FIG. 13 more clearly shows the manner in which the various passageways 77*a* are aligned between adjacent fins 76*a* of the heat sink 71. This view also depicts the larger diameter of the passageways 78*a* adjacent to the heat sink base 74.

In the present embodiment, the diameters of the passageways 77*a*, 77*b*, 78*a*, 78*b* are slightly smaller than the gap spacing of the fins 76*a*, 76*b* to allow for maximum exit area but still maintain the structural integrity of the heat sink 71. These passageways 77*a*, 77*b*, 78*a*, 78*b* are designed so that the area of the larger holes 78*a*, 78*b* are, in total, about the same as the area of the smaller holes 77*a*, 77*b*, when accounting for any differences due to pressure drop. Although not required, it is preferred that the holes 77*a*, 77*b*, 78*a*, 78*b* are small enough that they do not significantly increase the spreading resistance of the heat sink 71 due to loss of conductive material. However, the trade-off to a reduction in conductive material in the heat sink 71 is that the convective thermal resistance decreases due to the increase in exposed area to the flow.

Figure 14:
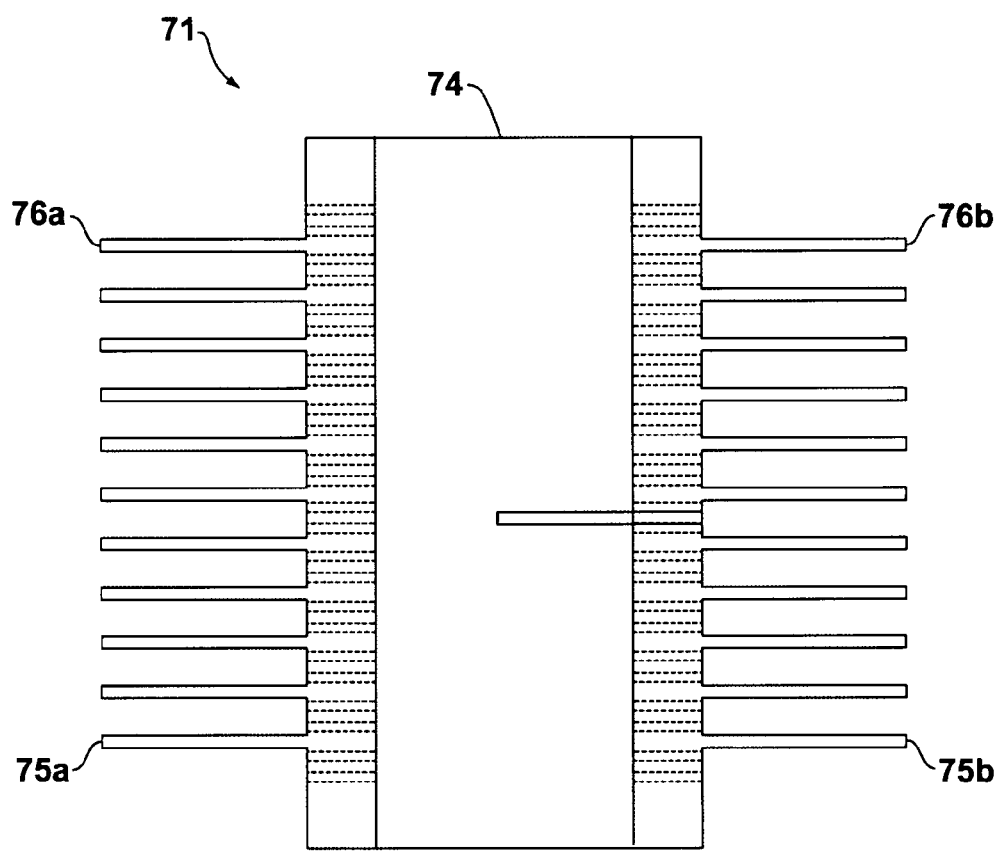
FIG. 14 is a bottom view of a heat sink used in an alternative embodiment of the cooling module depicted in FIG. 11.

The particular configuration of the various passageways 77*a*, 77*b*, 78*a*, 78*b* is not the only configuration possible. Indeed, there are many possible configurations of the passageways 77*a*, 77*b*, 78*a*, 78*b*. For example, it is not required that the passageways 77*a*, 77*b*, 78*a*, 78*b* have different diameters—or the same diameter. In addition, an alternative embodiment of the heat sink 71 is machined with more than one vertical row of passageways 77*a*, 77*b*, 78*a*, 78*b* between adjacent fins 76*a*, 76*b*. For example, FIG. 14 depicts a bottom view of a heat sink 71 having two vertical rows of passageways between each adjacent fin 76*a*, 76*b*.

As noted above, the heat sink 71 of the present embodiment 70 is configured to be joined with a synthetic jet actuator 72. FIG. 11 depicts the manner in which these two elements are joined in the present embodiment 70. This does not mean that the synthetic jet actuator 72 and the heat sink 71 are necessarily separate pieces of the overall module 70. Indeed, the synthetic jet actuator 72 may be manufactured out of aluminum, or some other conductive material, such that it functions as a part of the heat sink 71. In essence, the synthetic jet actuator 72, in this respect, is actually a part of the base 74, 75*a*, 75*b* of the heat sink 71.

Figure 15:
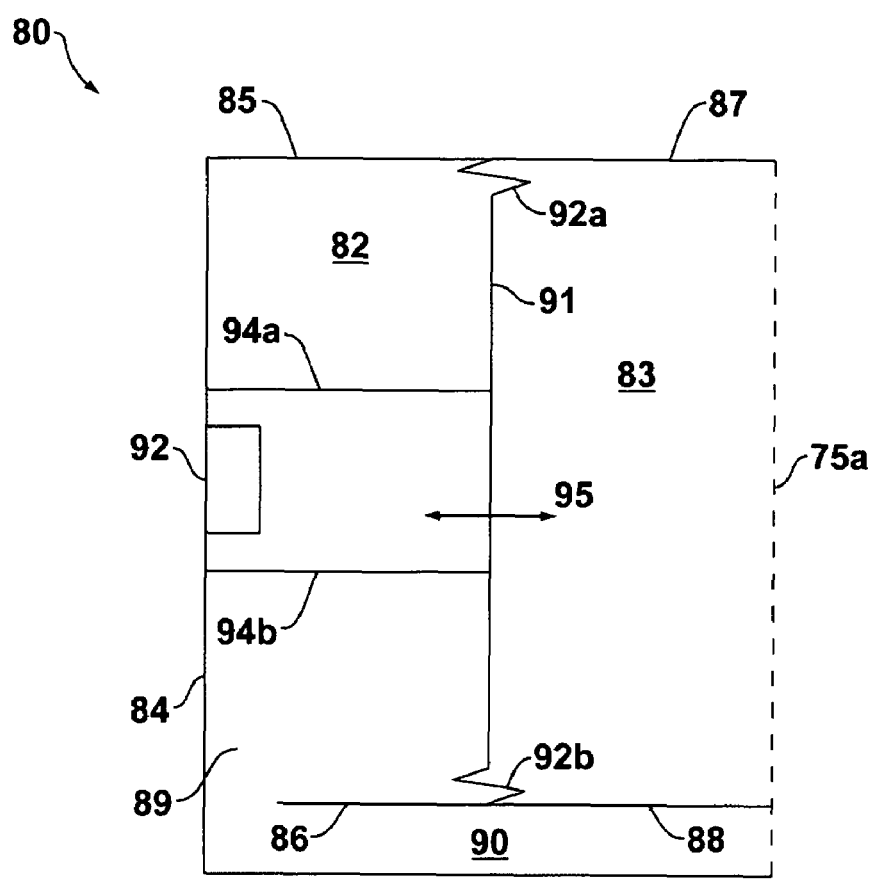
FIG. 15 is a cut-away side view of an actuator housing used in the alternative embodiment of a cooling module depicted in FIG. 11.

In reality, the synthetic jet actuator 72 of the present embodiment is comprised of a first actuator housing 80 and a second actuator housing 81, as shown in FIG. 11. The two actuator housings 80, 81 are almost identical in design and construction. FIG. 15 more specifically depicts the first actuator housing 80 in a cut-away side view. The discussion of this actuator housing 80 can be applied equally to the second actuator housing 81.

As depicted in FIG. 15, the first actuator housing 80 comprises two chambers 82, 83 that can be referred to as a first chamber 82 and a second chamber 83. The first chamber 82 has a left wall 84, a top wall 85, and a bottom wall 86. The first chamber 82 also comprises a back and front wall, which are not depicted in FIG. 15. The second chamber 83 comprises a top wall 87 and a bottom wall 88. The second chamber 83 does not have a right wall that is a part of the actuator housing 80. Rather, the right wall of the second chamber 83 is formed by one of the side walls 75*a* of the u-shaped heat sink 71 when the actuator housing 80 is inserted into the interior cavity of the heat sink 71. As with the first chamber 82, the back and front walls of the second chamber 83 are not depicted in FIG. 15.

As depicted in FIG. 15, the bottom wall 86 of the first chamber 82 does not completely seal the chamber 82. Rather, the bottom wall 86 forms an opening 89 into a plenum 90, fluidically connecting the first chamber 82 to the larger passageways 78*a* in the side walls of the heat sink 71 when the actuator housing 80 is inserted into the heat sink 71. The second chamber 83 is only fluidically connected to the smaller diameter chambers 77*a*.

Figure 16:
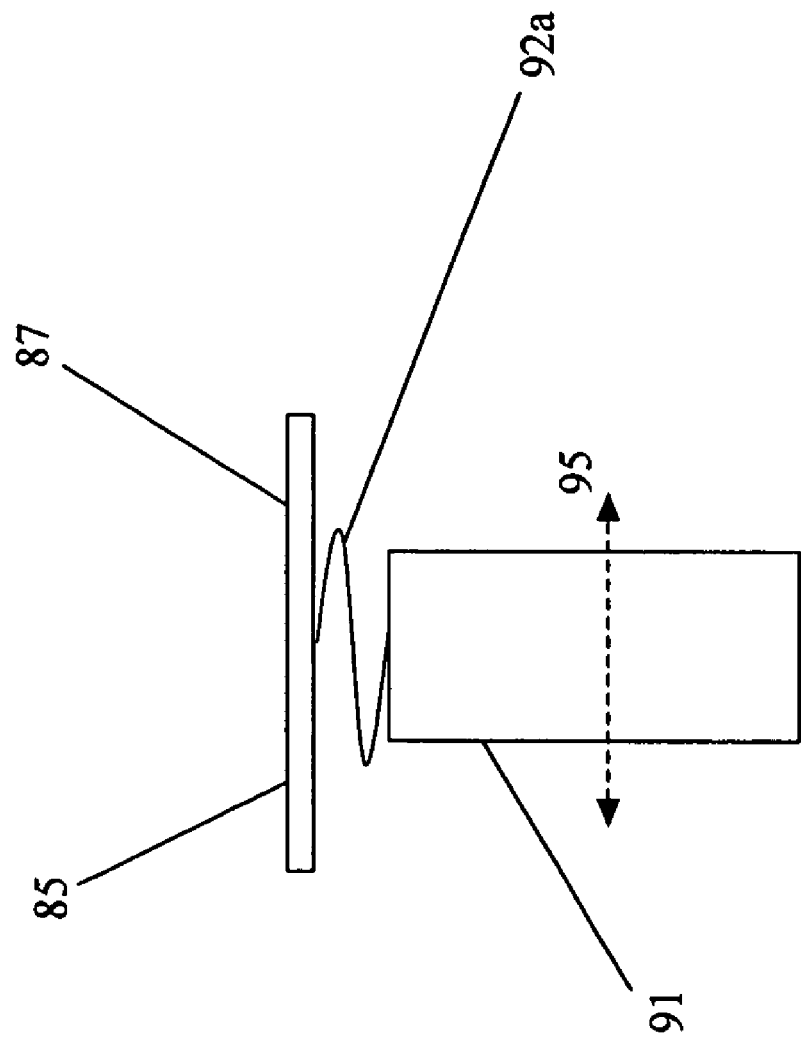
FIG. 16 is a magnified cut-away side view of a piston sealing mechanism of FIG. 15.

As will be noticed from the FIG. 15, the two actuator chambers 82, 83 share a common center wall 91. This wall 91 comprises a rigid piston-like structure, similar to the piston wall 53 described above with regard to the first embodiment 30 depicted in FIG. 5. The preferred piston 91 of the present embodiment 70 is not rigidly connected to the other walls of the actuator housing 80. Rather, the piston 91 is connected to the top walls 85, 87, bottom walls 86, 88, the back and front walls by a rolling diaphragm seal 92*a*, 92*b*. This rolling diaphragm seal 92*a*, 92*b* is more specifically depicted in FIG. 16.

The rolling diaphragm seal 92*a*, 92*b* used in the present embodiment 70 is the same as that described above with relation to FIG. 6 and its embodiment 30. As described above, the piston 91 may be attached to the walls of the chambers 82, 83 by many other mechanisms. In addition, as described above with regard to FIG. 8, the piston 91 in an alternative embodiment has no attachment mechanism at all. In this alternative embodiment, the piston 91 is machined such as to move very near the walls of the chambers.

In another alternative embodiment, the synthetic jet actuator 80 has a flexible diaphragm as the common wall 91 between the two chambers 82, 83. In yet another alternative embodiment, the actuator housings 80, 81 are constructed to have more than two internal chambers in each housing. As will be readily understood by one having skill in the art, this embodiment also comprises more than one piston wall in each actuator housing.

Returning to FIG. 15, the actuator housing 80 also comprises actuation hardware in the form of a magnet 93 affixed to the side wall 84 of the first chamber 82 and in the form of two current-carrying coils 94a, 94b. These elements of the actuation hardware comprise the fundamental elements of an electromagnetic actuation mechanism.

As described above in relation to the first embodiment 30, in operation, the electromagnetic actuation system depicted in FIG. 15 functions due to the interaction between the magnet 93 and the current-carrying coils 94a, 94b. The coils 94a, 94b are flexible and act similar to two springs in that they permit the piston wall 91 to move both toward and away from the magnet 93 in horizontal motion 95.

To actuate the piston wall 91, current is caused to flow through the coils 94a, 94b and due to the electromagnetic interaction with the magnet 93, the coils 94a, 94b expand and contract periodically. This moves the piston wall 91 toward and away from the side wall 84 in periodic motion 95. Consequently, the piston 91 periodically forces fluid out of the first chamber 82 (while drawing fluid into the second chamber 83) and into the first chamber 83 (while expelling fluid from the second chamber 82). The operation of the present embodiment 70 will be discussed in greater detail below.

As will be clearly understood by one with skill in the art, electromagnetic actuation is not required in the present embodiment 70. Indeed, in an alternative embodiment, a piezoelectric actuator is affixed to the piston wall 91 such as to actuate the wall. In other alternative embodiments, other configurations of electromagnetic actuators are used for driving the piston 91. For example, in one other alternative embodiment, the magnet 93 is attached to the piston 91 and the coils 94a, 94b are fashioned as attached to the side wall 84 only.

Generally, the electromagnetic actuation system depicted in FIG. 15 is controlled by a control system (not depicted) in order to cause the piston 91 to oscillate at a resonant frequency of the synthetic jet actuator 72. The preferred control system generally consists of a power supply to the coils 94a, 94b and a signal generator.

Operation of an Alternative Embodiment of an Active Cooling Module

As shown in FIG. 11, the active cooling module 70 comprises a heat sink 71 and an integrated synthetic jet actuator 72. To construct the module 70, the synthetic jet actuator 72 may be manufactured separately and then inserted into an interior portion of the u-shaped heat sink 71. In this case, the actuator 72 is typically attached to the heat sink 71 securely by the use of, for example, small screws or adhesive (not depicted).

Alternatively, the synthetic jet actuator 72 of the cooling module 70 may be constructed as a part of the heat sink 71. In this respect the synthetic jet actuator 72 is actually a part of the bottom portion 74 and side portions 75a, 75b of the heat sink 71.

Use of the present embodiment 70 generally involves positioning the base portion 74 of the heat sink 71 near or adjacent to a heated body (not depicted). The heat in the heated body flows into the base 74 of the heat sink 71, to the side portions 75a, 75b, and then into the fins 76a, 76b. In operation, the synthetic jet actuator 72 creates the effect of a jet ejector 20, as discussed above in relation to FIG. 2, between adjacent fins 76a, 76b of the heat sink 71. Particularly, the control system causes the piston in each actuator housing 80, 81 to oscillate in periodic motion. Preferably, though not required, the pistons are caused to oscillate at a resonant frequency of the system 70.

The oscillation of the piston 91 causes the volumes of the four chambers in the actuator housings 80, 81 (two chambers in each housing) to be alternatively increased and decreased. As the volume of a given chamber is increased, fluid is pulled in through the passageways 77a, 77b, 78a, 78b fluidically connected to the specific chamber having its volume increased. As explained above, the lower, larger diameter passageways 78a, 78b are fluidically connected to the interior chambers of the actuator housings 80, 81. The upper, smaller diameter passageways 77a, 77b are fluidically connected to the exterior chambers of the actuator housings 80, 81.

As the volume of that chamber is decreased, due to the periodic motion of the piston 91, fluid is ejected from the passageways 77a, 77b, 78a, 78b connected to that chamber. The suction and ejection phases of the actuator 72 creates a synthetic jet stream of fluid at the exit points of the passageways 77a, 77b, 78a, 78b. The synthetic jet streams travel down the channels between adjacent fins 76a, 76b and away from the side portions 75a, 75b of the heat sink 71.

Figure 17:
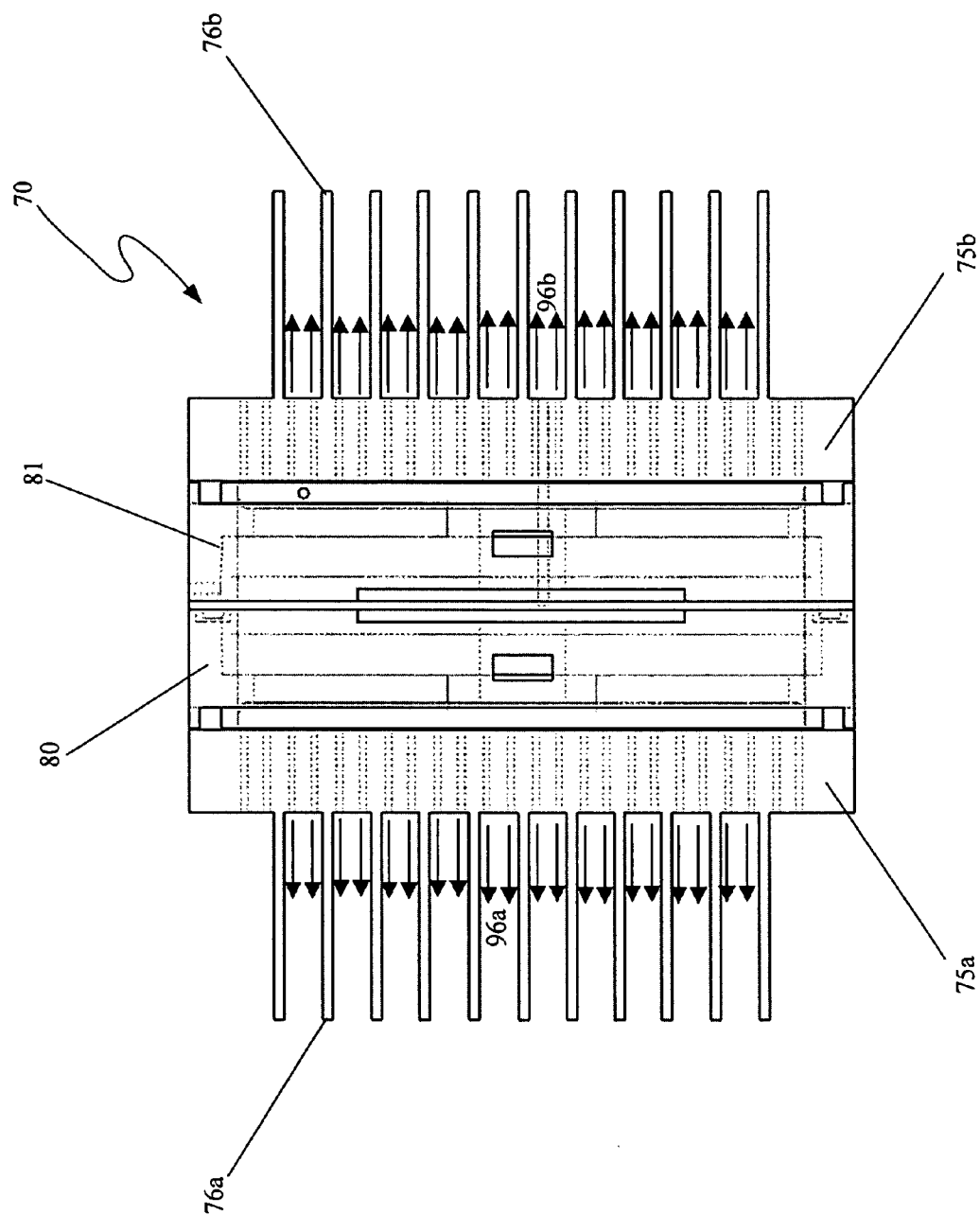
FIG. 17 is a top view of a heat sink used in an alternative embodiment of the cooling module depicted in FIG. 11.

FIG. 17 is a top view of an alternative embodiment having two columns of passageways between adjacent fins of the heat sink. In this figure, the operation of the module is shown in that synthetic jet steams 96a, 96b are emitted from each passageway.

Regardless of the number of passageways, as the synthetic jet streams travel down the channel formed by adjacent fins, a secondary flow of ambient fluid is created between the fins, similar to as described above with regard to the jet ejector 20 in FIGS. 2A and 2B and the first embodiment 30. Ambient fluid is drawn in from both a top portion 97a, 97b and a bottom portion 98a, 98b of the fins 76a, 76b (see FIG. 11). Of course, because the synthetic jet actuator 72 is creating zero net mass flux jets during the suction phase of the actuator 72, ambient fluid is continued to be pulled from the ambient environment into the channels formed by the fins of the heat sink 71.

There are several reasons why the present embodiment 70 may be desirable for certain applications. First, the ambient fluid is being forced across the entire surface of the fin 76a, 76b since the exit holes of the passageways 77a, 77b, 78a, 78b are distributed along the entire height and width of the fin array 76a, 76b. Although this is not required in the present embodiment 70, such a configuration of passageways 77a, 77b, 78a, 78b allows for greater air coverage of the entire module 70.

Second, for a zero net mass flux jet generally, air is drawn into a cavity and then expelled again as a jet. The passageways 77a, 77b, 78a, 78b of the present embodiment are, in essence, exits of synthetic jet actuators. Since the distance from the jet exit 77a, 77b, 78a, 78b to the edge of the heat sink fin 76a, 76b is relatively small, the heated air is able to be completely expelled to the ambient during a blowing phase. This allows for completely new, unheated ambient fluid to be used in the next pumping cycle of the jet actuator 72.

Third, in this present embodiment, all of the ambient fluid is drawn in through the heated fins 76a, 76b giving them more time to heat up. Since the fluid is moving much slower during the suction stage of the jet actuator 82, this allows a greater time for heat transfer from the hot surface to the cool air to occur.

Finally, the distribution of fluid coming from the passageways 77a, 77b, 78a, 78b is preferably not entirely evenly spread out. Although not required in the present embodiment, the hottest region of the heat sink 71 is usually near the base portion 74 of the sink 71 where the heated body is located. For this reason, the fluid flow near the bottom of the sink is the greatest due to the larger diameter passageways 78a, 78b. There is a larger jet stream with a high volume flow rate in this region, which helps with the refreshing of the ambient fluid drawn into the channels between adjacent fins 76a, 76b. These facts generally allow for greater cooling potential.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

The invention claimed is:

1. A device, comprising:
   a heat sink equipped with a base portion, a pair of adjacent fins disposed on an exterior surface of said base portion, and a channel defined by an area disposed between said fins;
   a synthetic jet actuator integrated with said heat sink; and
   a synthetic jet distribution device associated with said synthetic jet actuator, said synthetic jet distribution device comprising a tubular plenum equipped with an orifice; wherein said orifice is disposed at said channel, and wherein said synthetic jet distribution device is adapted to direct a fluid flow generated by the synthetic jet actuator into said channel.

2. The device of claim 1, wherein said synthetic jet actuator comprises:
   a chamber having walls enclosing a volume; and
   a wall of said chamber configured to change the volume of said chamber.

3. The device of claim 2, wherein said configured wall comprises a rigid piston.

4. The device of claim 2, wherein said configured wall comprises a flexible diaphragm.

5. The device of claim 3, wherein said rigid piston is attached to another wall of said chamber with a flexible material.

6. The device of claim 5, wherein said synthetic jet actuator further comprises:
   a magnet; and
   current-carrying coils, such that the generation of current in said coils creates periodic motion of said piston.

7. The device of claim 1, wherein said device is adapted to create a fluid flow at said orifice of said plenum, and wherein said fluid flow is in the area between adjacent fins and in a direction parallel to said base of said heat sink.

8. A method for dissipating heat, comprising:
   providing a heat sink structure equipped with a passage;
   providing a synthetic jet distribution device which emits a synthetic jet from each of a plurality of apertures disposed therein; and
   utilizing the synthetic jet distribution device to generate a synthetic jet stream in said passage;
   wherein said synthetic jet stream entrains an ambient fluid into said passage such that a flow of ambient fluid is formed in said passage, and wherein the flow of said fluid cools a wall of said passage.

9. The method of claim 8, wherein generating a synthetic jet stream comprises:
   providing a synthetic jet actuator having a chamber of ambient fluid;
   changing a volume of said chamber;
   creating a fluid flow out of said chamber; and
   generating vortices as a result of said created fluid flow, said vortices performing said entraining step.

10. A device, comprising:
    a heat sink equipped with a plurality of ducts;
    a chamber integrated with said heat sink, said chamber defining a volume of fluid;
    an actuator for changing said volume of said chamber thereby causing a fluid to flow into and out of said chamber; and
    a fluid distributor connected to said chamber, said distributor having a plurality of orifices oriented with respect to said plurality of ducts such that a synthetic jet stream forms at each of said plurality of orifices and flows into one of said plurality of ducts.

11. The device of claim 10, wherein said heat sink comprises a plurality of fins, and wherein each of said plurality of ducts comprises a space between adjacent fins.

12. The device of claim 11, wherein said fluid distributor comprises a tubular plenum connected to said chamber.

13. The device of claim 11, wherein said heat sink further comprises a base portion, said chamber and said actuator contained in said base portion of said heat sink.

14. The device of claim 13, wherein said fluid distributor comprises a passageway cut into said base portion of said heat sink.

15. A device, comprising:
    a heat sink having a base portion, a side wall portion connected to said base portion, and a pair of adjacent fins attached to an exterior surface of said side wall portion;
    a synthetic jet actuator integrated with said heat sink and adapted to generate a fluid flow; and
    a synthetic jet distribution device comprising passageways formed in said side wall portion which are adapted to direct the fluid flow generated from said synthetic jet actuator into the space between the adjacent fins.

16. The device of claim 15, wherein said fluid flow is emitted from said passageways such that said fluid flows between adjacent fins and away from said heat sink side wall portion.

17. The device of claim 16, wherein said fluid flow comprises a synthetic jet stream, and wherein said synthetic jet stream entrains an ambient fluid to flow between said adjacent fins.

18. The device of claim 15, wherein said base portion is essentially perpendicular to said sidewall portion.

19. The device of claim 18, wherein said pair of adjacent fins are essentially perpendicular to said sidewall portion.

20. The device of claim 15, wherein said heat sink comprises first and second sidewall portions, wherein said first sidewall portion has a first set of fins disposed thereon, and wherein said second sidewall portion has a second set of fins disposed thereon.

21. The device of claim 15, wherein said jet distribution device comprises a tubular plenum having a plurality of orifices, and wherein said plenum is configured such that each of said plurality of orifices is disposed at said area between adjacent fins.

22. The device of claim 15, wherein said fluid flow comprises a synthetic jet stream, and wherein said synthetic jet stream entrains an ambient fluid to flow between said adjacent fins.

23. A device, comprising:
a heat sink having a plurality of channels;
a synthetic jet actuator integrated with said heat sink, said synthetic jet actuator being adapted to generate a fluid flow; and
a synthetic jet distribution device associated with said synthetic jet actuator, said synthetic jet distribution device being adapted to emit a plurality of synthetic jets, wherein each of said plurality of synthetic jets is directed into one of said plurality of channels.

24. A device, comprising:
a housing;
a synthetic jet actuator disposed within said housing; and
a plurality of fins disposed on the exterior of said housing;
wherein said housing is equipped with a plurality of channels, wherein each of said plurality of channels is in fluidic communication with said synthetic jet actuator and with the exterior of said housing, and wherein each of said plurality of channels is adapted to direct a synthetic jet along a surface of at least one of said plurality of fins.

25. The device of claim 24, wherein each of said plurality of channels is adapted to direct a synthetic jet along a surface of at least two of said plurality of fins.

26. The device of claim 24, wherein said housing has walls, and wherein said plurality of channels are disposed within said walls of said housing.

27. The device of claim 26, wherein said housing has first and second opposing walls, wherein said first wall has a first set of fins disposed on an exterior surface thereof, and wherein said second wall has a second set of fins disposed on an exterior surface thereof.

28. The device of claim 27, wherein said first set of fins extends perpendicularly from a first major surface of said first wall, and wherein said second set of fins extends perpendicularly from a second major surface of said second wall.

29. The device of claim 24, wherein said plurality of fins includes first and second adjacent fins, and wherein said plurality of channels are adapted to direct a plurality of synthetic jets between said first and second fins.

30. The device of claim 24, wherein each of said plurality of fins has first and second major surfaces, and wherein said plurality of channels are adapted to direct a plurality of synthetic jets along the first and second major surfaces of each of said plurality of fins.

31. The device of claim 24, wherein said synthetic jet actuator further comprises:
a magnet;
a current carrying coil; and
a diaphragm.

* * * * *

UNITED STATES PATENT AND TRADEMARK OFFICE
CERTIFICATE OF CORRECTION

PATENT NO. : 7,252,140 B2  Page 1 of 1
APPLICATION NO. : 11/217759
DATED : August 7, 2007
INVENTOR(S) : Ari Glezer et al.

It is certified that error appears in the above-identified patent and that said Letters Patent is hereby corrected as shown below:

Title page #73- - -Assignee

Nuveatix ---should read--- Nuventix

Signed and Sealed this

Fourth Day of March, 2008

JON W. DUDAS
*Director of the United States Patent and Trademark Office*